(12) United States Patent
Uchiyama

(10) Patent No.: US 7,732,273 B2
(45) Date of Patent: Jun. 8, 2010

(54) SEMICONDUCTOR DEVICE MANUFACTURING METHOD AND SEMICONDUCTOR DEVICE

(75) Inventor: Hiroyuki Uchiyama, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 4 days.

(21) Appl. No.: 12/213,624

(22) Filed: Jun. 23, 2008

(65) Prior Publication Data

US 2008/0268606 A1 Oct. 30, 2008

Related U.S. Application Data

(62) Division of application No. 11/397,813, filed on Apr. 5, 2006, now abandoned.

(30) Foreign Application Priority Data

Apr. 8, 2005 (JP) ............... 2005-111554

(51) Int. Cl.
H01L 21/8242 (2006.01)
H01L 21/20 (2006.01)
(52) U.S. Cl. .............. 438/239; 438/253; 438/396; 257/E21.649
(58) Field of Classification Search ......... 438/239, 438/250, 253, 393, 396; 257/E21.648, E21.649
See application file for complete search history.

(56) References Cited

U.S. PATENT DOCUMENTS

| 5,150,276 | A |   | 9/1992  | Gonzalez et al. |         |
|-----------|---|---|---------|-----------------|---------|
| 5,247,196 | A |   | 9/1993  | Kimura          |         |
| 6,046,489 | A |   | 4/2000  | Yamaguchi       |         |
| 6,104,063 | A | * | 8/2000  | Fulford et al.  | 257/344 |
| 6,146,961 | A |   | 11/2000 | Graettinger et al. |      |
| 6,277,688 | B1|   | 8/2001  | Tseng           |         |
| 6,392,264 | B2|   | 5/2002  | Takeuchi et al. |         |
| 6,479,343 | B1| * | 11/2002 | Hwang et al.    | 438/253 |
| 6,548,844 | B1|   | 4/2003  | Fukuzumi et al. |         |
| 6,765,256 | B2|   | 7/2004  | Takeuchi et al. |         |
| 6,822,312 | B2| * | 11/2004 | Sowlati et al.  | 257/532 |

(Continued)

FOREIGN PATENT DOCUMENTS

JP          05-267614          10/1993

(Continued)

*Primary Examiner*—Tuan N. Quach
(74) *Attorney, Agent, or Firm*—McDermott Will & Emery LLP

(57) ABSTRACT

A manufacturing method of a semiconductor device having a highly reliable capacitor, and the semiconductor device are provided. The semiconductor device manufacturing method according to the present invention includes: a first step of forming a first electrode of a capacitor on a semiconductor substrate; a second step of forming a capacitor insulating film on the whole surface including a side surface and an upper surface of the first electrode; a third step of forming a protection insulating film made of a material different from that of the capacitor insulating film, on the capacitor insulating film; a fourth step of removing the protection insulating film and the capacitor insulating film from the upper surface of the first electrode, by anisotropically etching the protection insulating film and the capacitor insulating film; a fifth step of removing the protection insulating film that remains on the side surface of the first electrode; and a sixth step of forming a second electrode of the capacitor on the capacitor insulating film, after removing the protection insulating film.

19 Claims, 13 Drawing Sheets

U.S. PATENT DOCUMENTS

| | | |
|---|---|---|
| 6,833,579 B2 | 12/2004 | Sandhu et al. |
| 6,867,451 B2 | 3/2005 | Hieda et al. |
| 2001/0031529 A1 | 10/2001 | Hofmann et al. |
| 2005/0087879 A1* | 4/2005 | Won et al. .................. 257/758 |
| 2005/0121713 A1 | 6/2005 | Toshiba et al. |

FOREIGN PATENT DOCUMENTS

| | | |
|---|---|---|
| JP | 11-345948 | 12/1999 |
| JP | 2000-332213 | 11/2000 |
| JP | 2001-024169 | 1/2001 |
| JP | 2004-111711 | 4/2004 |

* cited by examiner

SEMICONDUCTOR DEVICE MANUFACTURING METHOD AND SEMICONDUCTOR DEVICE

RELATED APPLICATIONS

This application is a Divisional of U.S. application Ser. No. 11/397,813, filed Apr. 5, 2006 now abandoned, claiming priority of Japanese Application No. 2005-111554, filed Apr. 8, 2005, the entire contents of each of which are hereby incorporated by reference.

TECHNICAL FIELD

The present invention relates to a semiconductor device manufacturing method and a semiconductor device. Particularly, the invention relates to a semiconductor device having a stacked capacitor, and a method of manufacturing the semiconductor device.

BACKGROUND OF THE INVENTION

Conventionally, in a DRAM (Dynamic Random Access Memory) having a stacked capacitor, in order to compensate for a decrease of electrostatic capacitance due to a reduction in the size of the capacitor, the height of the capacitor has been increased or a high dielectric material has been used for a capacitor insulating film.

However, when the size of the capacitor further decreases in future, the above measure is not sufficient, and the configuration of the capacitor needs to be more complex. When the capacitor has a more complex configuration, a process of processing the capacitor insulating film becomes additionally necessary. For example, when a capacitor configuration in which plural capacitor layers are laminated is considered, in order to secure a connection between an upper electrode of a lower layer and an upper electrode of an upper layer and between a lower electrode of the lower layer and a lower electrode of the upper layer, respectively, it becomes necessary to perform etch back or the like on the capacitor insulating film, thereby exposing a connection part between the upper and the lower electrodes. When the capacitor insulating film is to be etched, the following problems occur.

FIG. 13A to FIG. 13C show processes of forming one capacitor layer of a capacitor having the laminated configuration.

First, as shown in FIG. 13A, an electrode film is formed on a ground interlayer insulating film 200. This electrode film is patterned to form a lower electrode 201. A capacitor insulating film 202 is formed on the whole surface including a side surface and an upper surface of the lower electrode 201. Next, the capacitor insulating film 202 is anisotropically etched, or etched back on the whole surface, to leave the capacitor insulating film on only the side wall of the lower electrode 201, as shown in FIG. 13B. As a result, the capacitor insulating film on the upper surface of the lower electrode 201 is removed. With this arrangement, a lower electrode (not shown) of the next capacitor layer to be formed on this capacitor layer can be connected to the lower electrode 201, on the exposed upper surface of the lower electrode 201.

However, due to this etch back process, an adhesion X of an etching damage, a residual molecule of an etching product, or the like occurs on the surface of the capacitor insulating film 202. This etching damage, the residual molecule, or the like increases a leakage of current between an upper electrode 203 and the lower electrode 201 as shown by an arrowhead A in FIG. 13C, thereby decreasing reliability of the capacitor.

At a lower end of the capacitor insulating film 202, there is an interface with the interlayer insulating film 200, and a connection of atom level is disconnected. Further, due to the etch back, the capacitor insulating film becomes locally thin. Consequently, leakage current occurs easily at the lower end of the capacitor insulating film 202, as shown by an arrowhead B in FIG. 13C.

Semiconductor devices having the stacked capacitors are described in, for example, Japanese Patent Application Laid-open Nos. 2000-332213, H05-267614, H11-345948, 2004-111711, and 2001-24169.

SUMMARY OF THE INVENTION

The present invention has been achieved to solve the above problems. It is an object of the present invention to provide a manufacturing method of a semiconductor device having a highly reliable capacitor, which suppresses an etching damage on a capacitor insulating film of the capacitor and suppress occurrence of leakage current, and the semiconductor device.

It is another object of the invention to provide a semiconductor device that can suppress the occurrence of leakage current at the lower end of a capacitor insulating film of a capacitor, and a method of manufacturing this semiconductor device.

The semiconductor device manufacturing method according to the present invention includes: a first step of forming a first electrode of a capacitor on a semiconductor substrate; a second step of forming a capacitor insulating film on the whole surface including a side surface and an upper surface of the first electrode; a third step of forming a protection insulating film made of a material different from that of the capacitor insulating film, on the capacitor insulating film; a fourth step of removing the protection insulating film and the capacitor insulating film from the upper surface of the first electrode, by anisotropically etching the protection insulating film and the capacitor insulating film; a fifth step of removing the protection insulating film that remains on the side surface of the first electrode; and a sixth step of forming a second electrode of the capacitor on the capacitor insulating film, after removing the protection insulating film.

According to the semiconductor device manufacturing method of the present invention, the surface of the capacitor insulating film is protected by the protection insulating film, at the time of performing anisotropic etching of the capacitor insulating film. Therefore, an etching damage or a residual molecule of an etching product occurs on only the surface of the protection insulating film. Since the protection insulating film is removed after the etching, a damaged layer and a residual molecule of the protection insulating film can be completely removed. Therefore, the surface of the capacitor insulating film can be kept clean. Consequently, increase in the leakage current of the capacitor and reduction in reliability can be prevented.

Further, after performing the anisotropic etching, a part of the capacitor insulating film that extends in a direction of a second electrode is formed in a width corresponding to the film thickness of the protection insulating film, at a lower end of the capacitor insulating film. Accordingly, the occurrence of leakage current between a first electrode and a second electrode at the lower end of the capacitor insulating film can be suppressed.

The semiconductor device includes a capacitor according to the present invention comprising: a first electrode provided on a semiconductor substrate; a capacitor insulating film provided on a side surface of the first electrode; and a second electrode provided on a surface of the capacitor insulating film facing the first electrode, wherein the capacitor insulating film has a first part along the side surface of the first electrode, and a second part extending substantially in parallel with the semiconductor substrate from a lower end of the first part in a direction of the second electrode.

According to the semiconductor device of the present invention, presence of the second part at the lower end of the capacitor insulating film can suppress the occurrence of leakage current between the first electrode and the second electrode at the lower end of the capacitor insulating film.

BRIEF DESCRIPTION OF THE DRAWINGS

The above and other objects, features and advantages of the present invention will become more apparent by reference to the following detailed description of the invention taken in conjunction with the accompanying drawings, wherein.

DETAILED DESCRIPTION OF THE EMBODIMENTS

An exemplary embodiment of a semiconductor device manufacturing method according to the present invention will be explained below with reference to the accompanying drawings. The present invention is adopted in a DRAM in the embodiment.

FIG. 1 to FIG. 10 are partial cross-sectional diagrams showing a process of manufacturing the DRAM according to the present embodiment.

Figure 1:
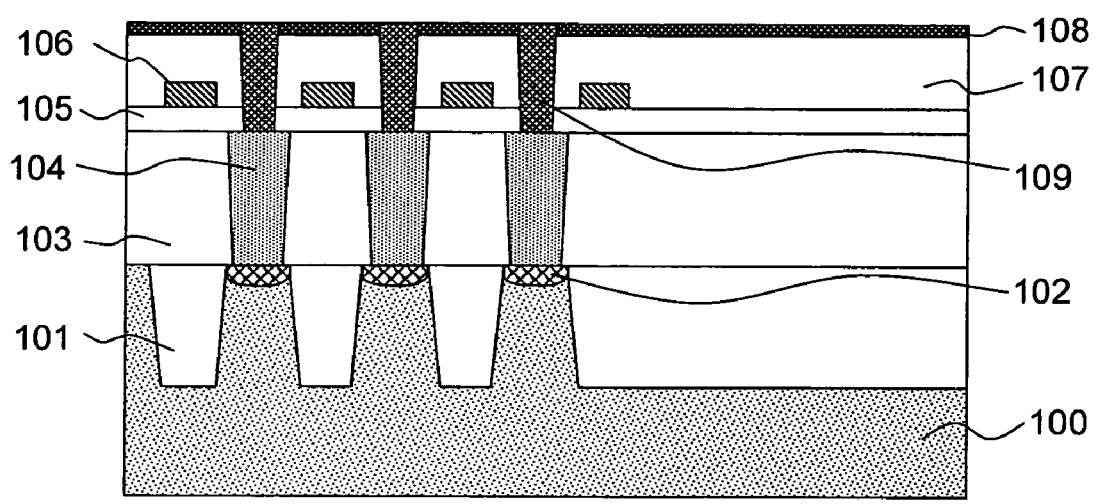
FIG. 1 is a partial cross-sectional diagram showing one step (formation of an element isolation region 101 to contact plugs 109) in a method of manufacturing a semiconductor device according to an embodiment of the present invention.

First, as shown in FIG. 1, an element isolation region 101 consisting of a silicon oxide film is formed on a semiconductor substrate 100 by an STI (Shallow Trench Isolation) method, and then, memory cell transistors are formed. In FIG. 1, a gate electrode is not shown, because the diagram shows a cross section along an extension direction of a word line. Diffusion layers 102, each of which is one of two diffusion layers (source/drain layers) of each memory cell transistor, are shown in FIG. 1.

Next, an interlayer insulating film 103 is formed on the whole surface, and thereafter, contact plugs 104 that are respectively connected to the diffusion layers 102 are formed. Polysilicon can be used for a material of the contact plugs 104. Next, an interlayer insulating film 105 is formed on the whole surface, and then, contact plugs (not shown) to be respectively connected to bit lines and the contact plugs 104 or the other diffusion layers are formed. Thereafter, a tungsten film is formed on the whole surface, and the tungsten film is patterned to form bit lines 106.

Next, a silicon oxide film 107 and a silicon nitride film 108 are formed on the whole surface, and contact plugs 109 are formed. The contact plugs 109 are formed to be respectively connected to the contact plugs 104. A laminated film of Ti/TiN and tungsten (W) can be used for a material of the contact plugs 109. The configuration as shown in FIG. 1 is obtained through the above process.

Figure 2:
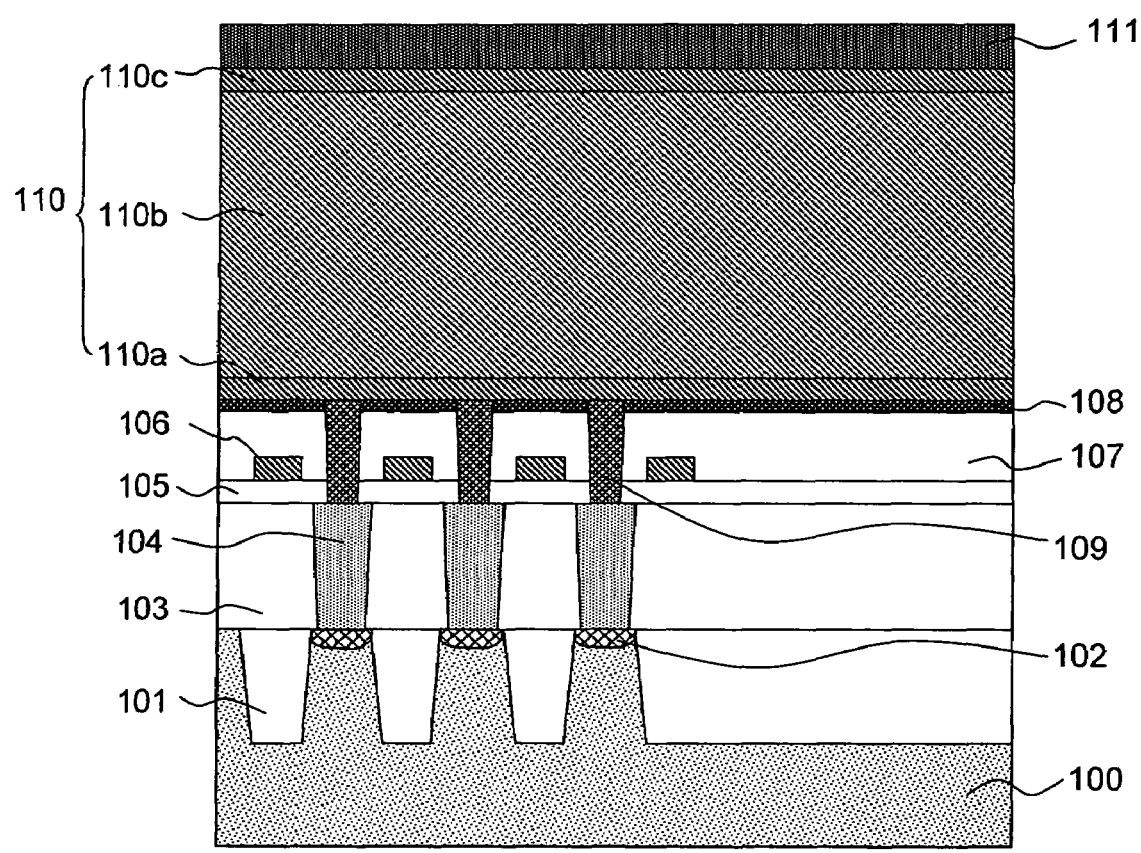
FIG. 2 is a partial cross-sectional diagram showing one step (formation of a conductive film 110 and a silicon nitride film 111) in the method of manufacturing the semiconductor device according to the embodiment of the present invention.
Figure 3:
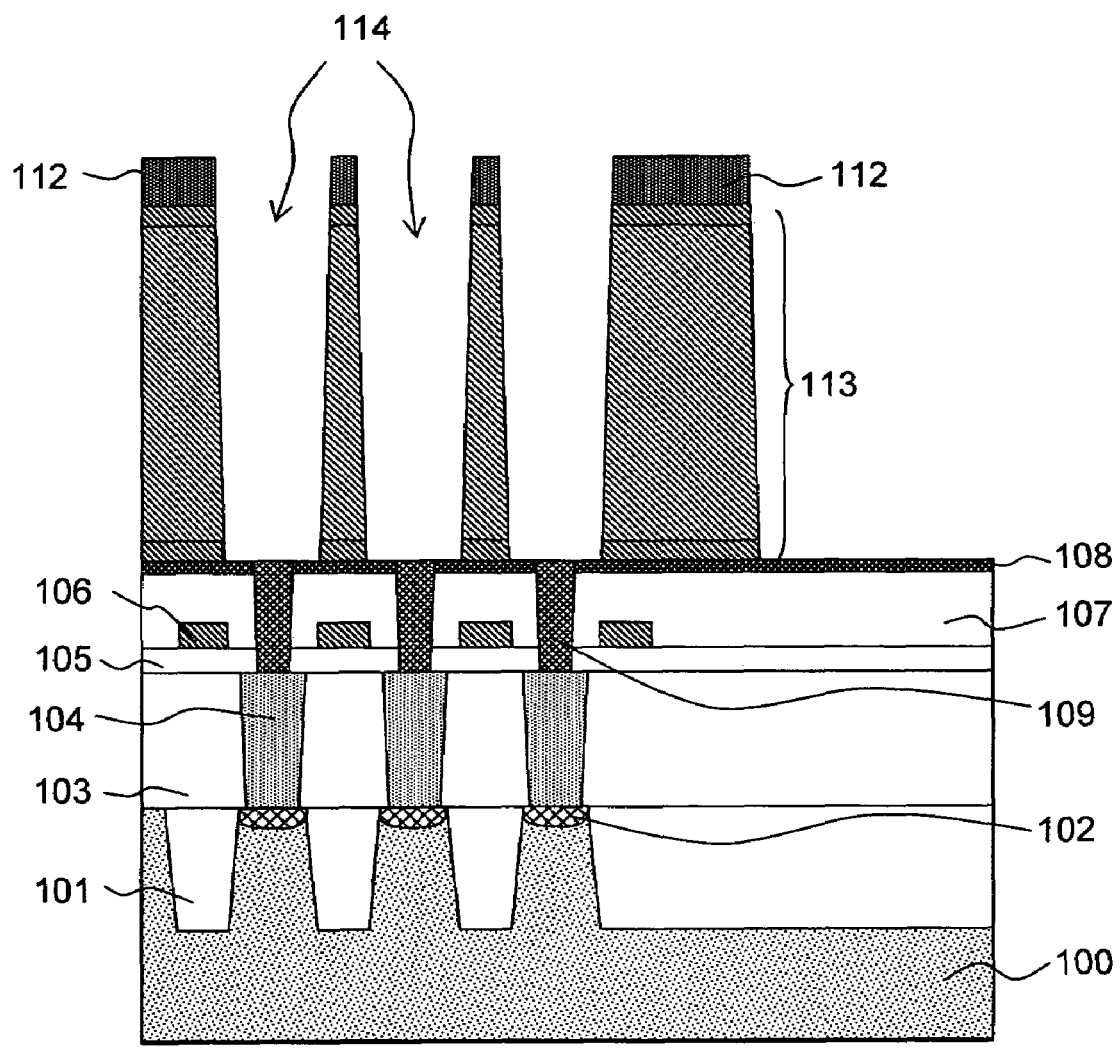
FIG. 3 is a partial cross-sectional diagram showing one step (patterning of the conductive film 110 and the silicon nitride film 111) in the method of manufacturing the semiconductor device according to the embodiment of the present invention.

Next, as shown in FIG. 2, a conductive film 110 having a thickness of about 900 nm and a silicon nitride film 111 having a thickness of about 200 nm are formed in this order on the whole surface. The conductive film 110 is a laminated film of a Ti/TiN film 110a having a thickness of about 20/30 nm, an AlCu film 110b having a thickness of about 800 nm, and a TiN film 110c having a thickness of about 50 nm, in this order. The silicon nitride film 111 is patterned using a mask (not shown), according to a lithographic technique, thereby forming a cap insulating film 112 as shown in FIG. 3. The conductive film 110 (see FIG. 2) is patterned to form a plate electrode 113, which is used as a common plate electrode for a plurality of capacitors. The plate electrode 113 is formed to avoid plural contact plugs 109. Accordingly, the upper surfaces of the contact plugs 109 are exposed by through-holes 114. When etching control is poor at the time of patterning the conductive film 110 (i.e., at the time of forming the plate electrode 113) and when the contact plugs 109 at the bottom of the through-holes 114 collapse greatly, it is preferable to form a stopper insulating film in advance on the contact plugs 109. The plate electrode 113 is one large electrode that is provided in common to plural memory cell transistors.

Although the plate electrode 113 is divided in the cross-sectional diagram shown in FIG. 3, this is continuous in other cross section.

Figure 4:
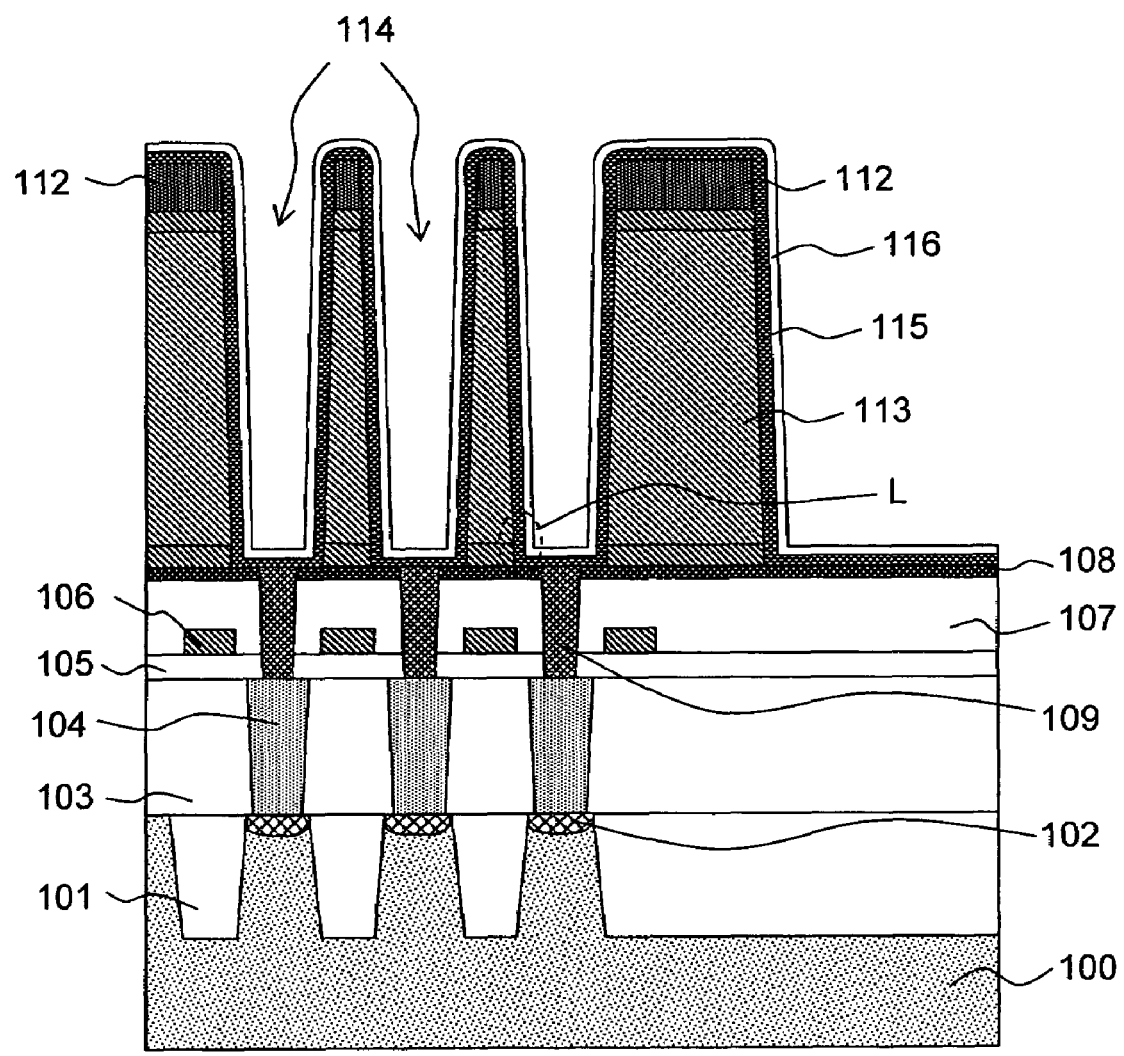
FIG. 4 is a partial cross-sectional diagram showing one step (formation of a tantalum oxide film 115 and a silicon oxide film 116) in the method of manufacturing the semiconductor device according to the embodiment of the present invention.

Next, as shown in FIG. 4, a tantalum oxide ($Ta_2O_5$) film 115 having a thickness of about 5 nm that becomes a capacitor insulating film of the capacitor is formed on the whole surface by an ALD (Atomic Layer Deposition) method, without removing the cap insulating film 112. A silicon oxide film 116 having a thickness of about 5 nm is formed as a protection insulating film on the tantalum oxide film 115. As a result, the surfaces of the plate electrode 113 and the contact plug 109 are covered with the tantalum oxide film 115 and the silicon oxide film 116.

Figure 5:
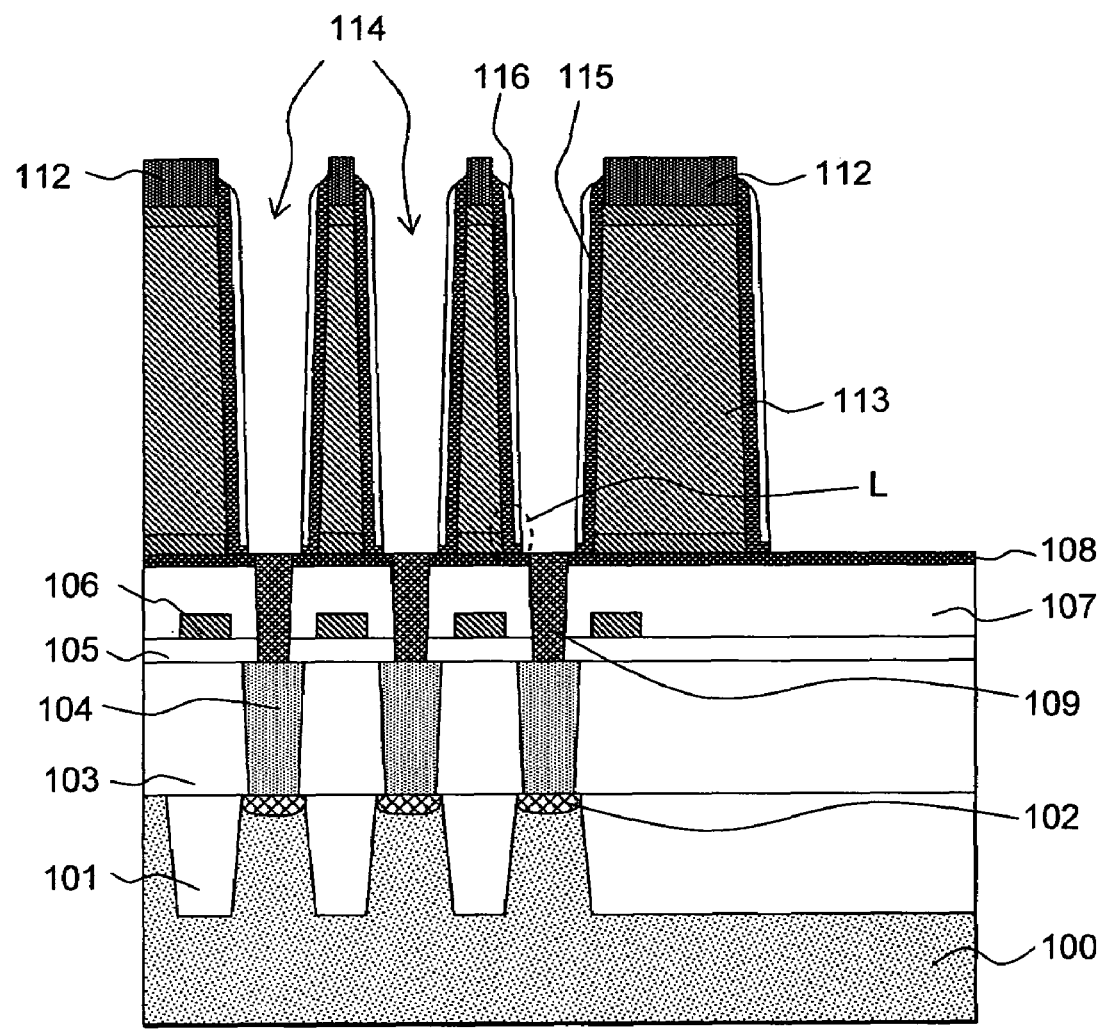
FIG. 5 is a partial cross-sectional diagram showing one step (etching back of the silicon oxide film 116 and the tantalum oxide film 115) in the method of manufacturing the semiconductor device according to the embodiment of the present invention.

Next, as shown in FIG. 5, anisotropic etching is performed on the silicon oxide film 116, and then on the tantalum oxide film 115. The anisotropic etching can be performed on the whole surface of the silicon oxide film 116 and the tantalum oxide film 115, respectively, without using a mask. As a result, the silicon oxide film 116 and the tantalum oxide film 115 that are formed in a region parallel with the semiconductor substrate 100 can be removed. Consequently, the upper surfaces of the contact plugs 109 are exposed at the bottom of the through-holes 114. On the other hand, the silicon oxide film 116 and the tantalum oxide film 115 that are formed in a region substantially perpendicular to the semiconductor substrate 100 are not removed. Consequently, the tantalum oxide film 115 and the silicon oxide film 116 remain on the side surface of the plate electrode 113 and on the inner side surface of the through-holes 114.

While an etching damage and an etching product adhere to the surface of the silicon oxide film 116 in the anisotropic etching (etch back) process, the silicon oxide film 116 becomes the etching protection film. Therefore, adhesion of an etching damage or an etching product to the tantalum oxide film (capacitor insulating film) 115 beneath the silicon oxide film 116 can be prevented.

Figure 6:
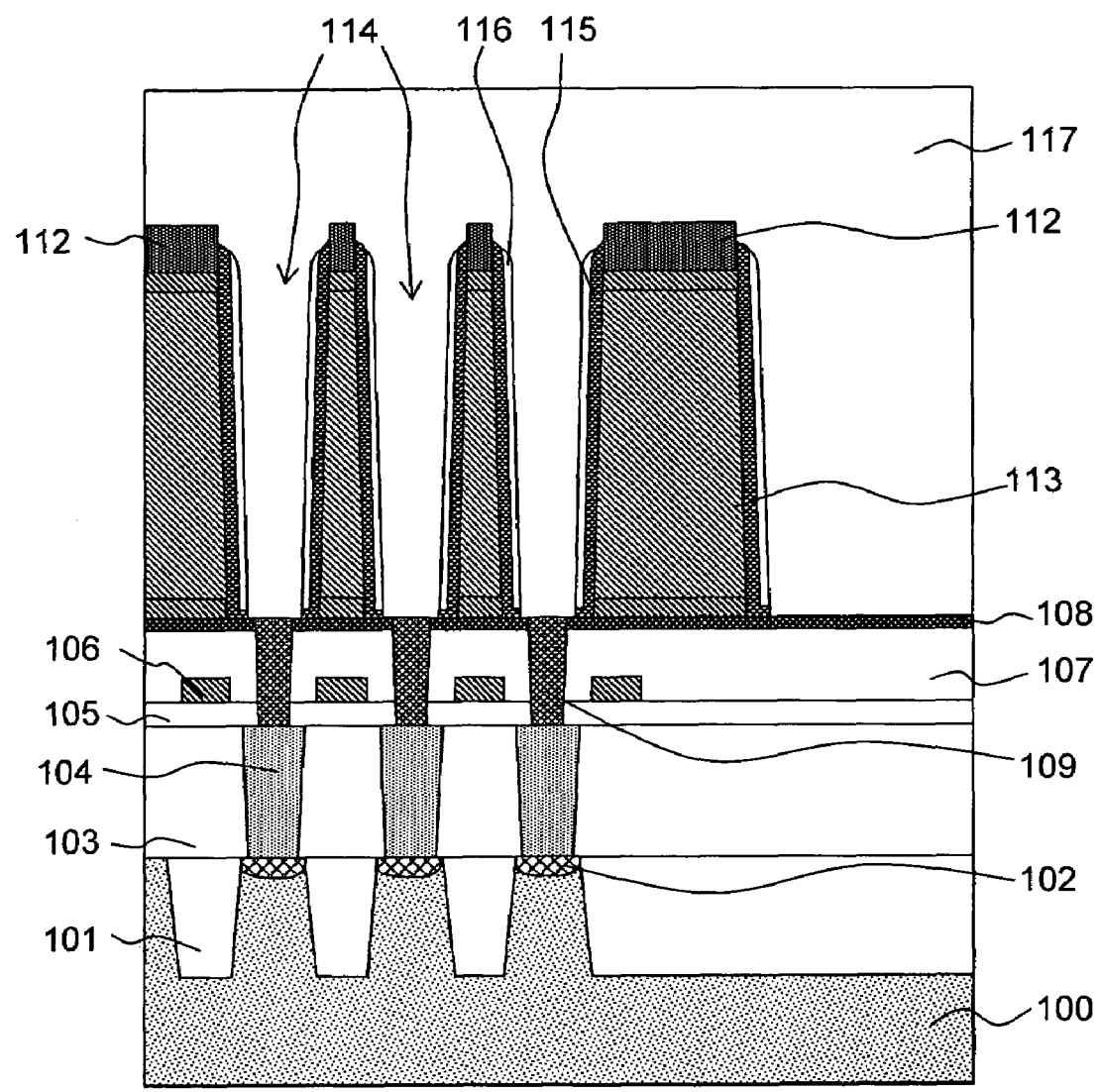
FIG. 6 is a partial cross-sectional diagram showing one step (formation of a silicon oxide film 117) in the method of manufacturing the semiconductor device according to the embodiment of the present invention.

Next, as shown in FIG. 6, a silicon oxide film 117 with a large thickness is formed on the whole surface so as to fill the through-holes 114. Thereafter, the silicon oxide film 117 is flattened by a CMP (Chemical Mechanical Polishing) method. While FIG. 6 shows a state that the silicon oxide film 117 remains on the cap insulating film 112, when control according to the CMP method is sufficient, the cap insulating film 112 can be exposed as a stopper film according to the CMP method.

Figure 7:
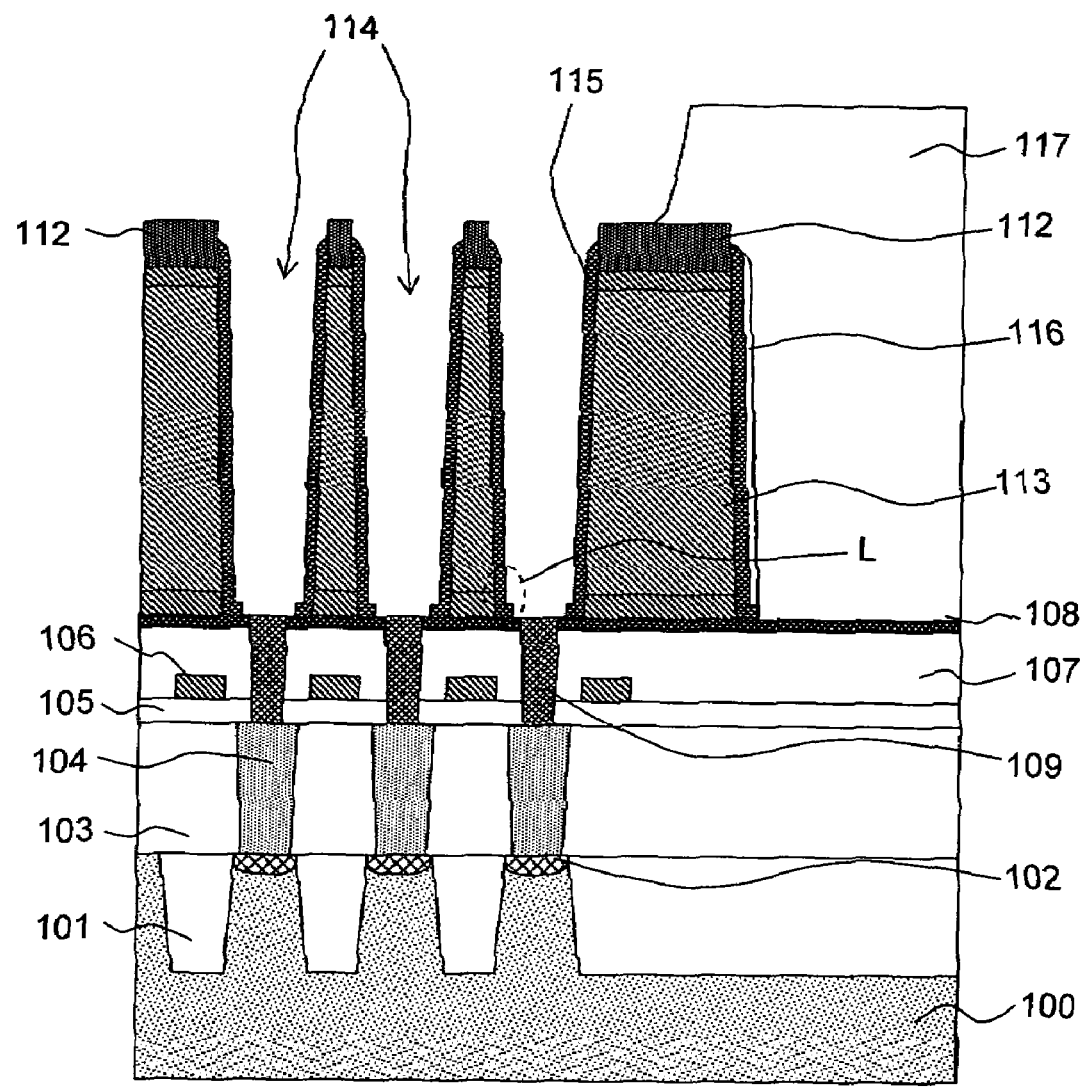
FIG. 7 is a partial cross-sectional diagram showing one step (selectively removing of the silicon oxide films 117 and 116) in the method of manufacturing the semiconductor device according to the embodiment of the present invention.

Next, as shown in FIG. 7, regions other than where the through-holes 114 are formed are covered with a mask layer (not shown), and wet etching is performed using hydrofluoric acid or the like, thereby selectively removing the silicon oxide film 117 and the silicon oxide film (protection insulating film) 116 within the through-holes 114. As a result, the upper surfaces of the contact plugs 109 are exposed again on the bottom surfaces of the through-holes 114. The protection insulating film 116 that received the etching damage and the like by the last etch back process is removed by this wet etching, and the capacitor insulating film 115 that has not received the etching damage is exposed.

Figure 8:
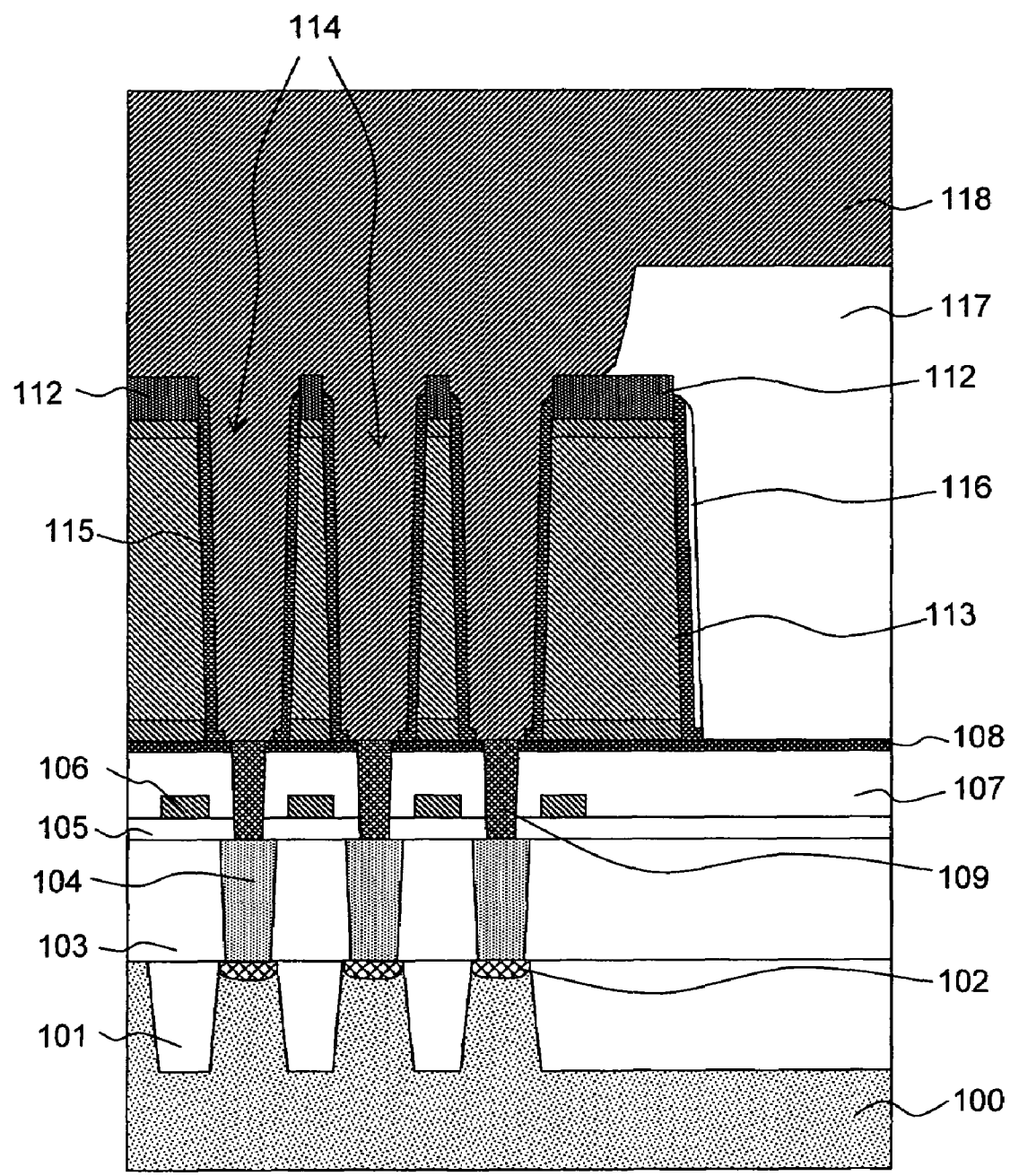
FIG. 8 is a partial cross-sectional diagram showing one step (formation of a tungsten film 118) in the method of manufacturing the semiconductor device according to the embodiment of the present invention.

As shown in FIG. 8, a tungsten film 118 is formed on the whole surface so as to fill the through-holes 114.

Figure 9:
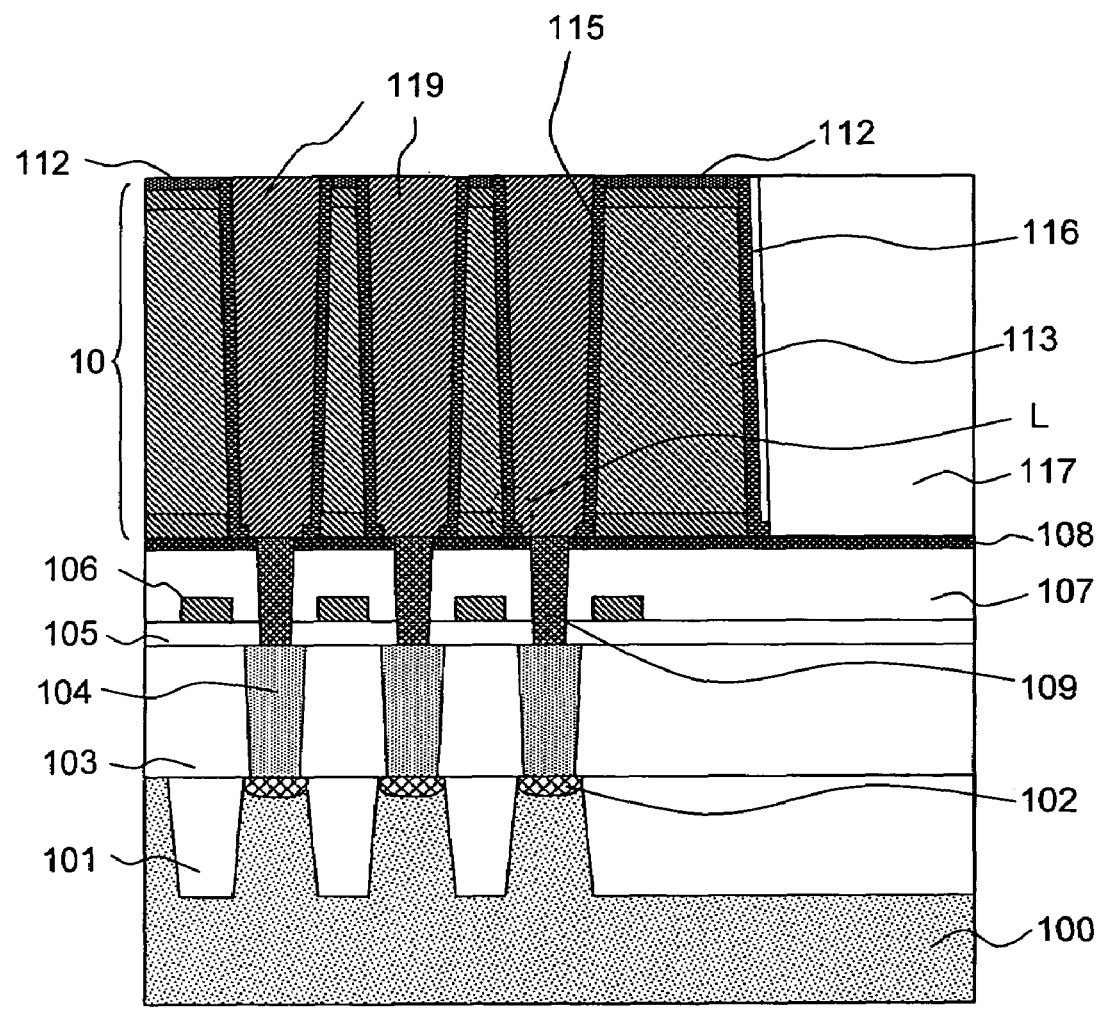
FIG. 9 is a partial cross-sectional diagram showing one step (polishing of the tungsten film 118 by the CMP method) in the method of manufacturing the semiconductor device according to the embodiment of the present invention.

Next, the tungsten film 118 and the silicon oxide film 117 are polished by the CMP method, using the cap insulating film 112 as a stopper. In this process, storage electrodes 119 of the capacitors filled in the through-holes 114 are obtained as shown in FIG. 9. As a result, capacitor layer 10 consisting of the storage electrodes 119, the tantalum oxide films (capacitor insulating films) 115, and the plate electrode 113 is formed.

Figure 10:
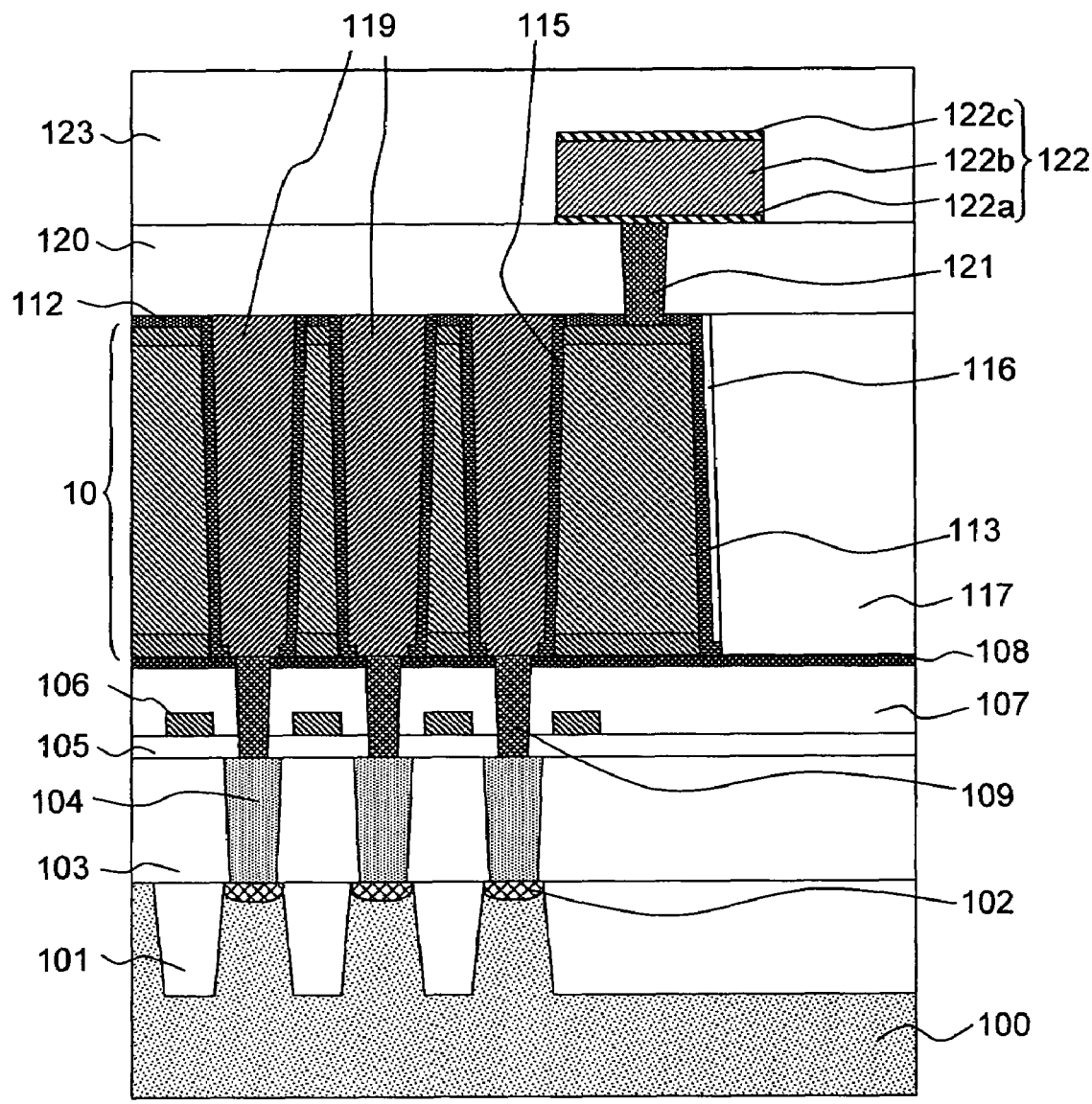
FIG. 10 is a partial cross-sectional diagram showing one step (formation of an interlayer insulating film 120 to formation of an interlayer insulating film 123) in the method of manufacturing the semiconductor device according to the embodiment of the present invention.

Next, as shown in FIG. 10, an interlayer insulating film 120 is formed on the capacitor layer 10, and a contact plug 121 to be connected to the plate electrode 113 of the capacitor layer 10 is formed. Further, a laminated film of a TiN/Ti film 122a, an AlCu film 122b, and a TiN film 122c is formed on the interlayer insulating film 120. The laminated film is patterned to form a wiring layer 122. Thereafter, an insulating film 123 that covers the wiring layer 122 is formed. Further, wiring connection plugs and upper layer wirings (not shown) are formed by a necessary number of layers. Last, a protection film is generated on the top wiring layer, and a connection hole is formed on the protection film to expose an electrode pad, thereby completing a DRAM.

Advantageous effects of the embodiment will be explained in detail below.

FIG. 11A to FIG. 11D show partially enlarged views of a lower end periphery L of the plate electrode 113 in the processes shown in FIGS. 4, 5, 7, and 9, respectively. While the plate electrode 113 is a laminated film, this plate electrode 113 is shown as a single layer in FIG. 11A to FIG. 11D, for the sake of convenience.

Figure 11A:
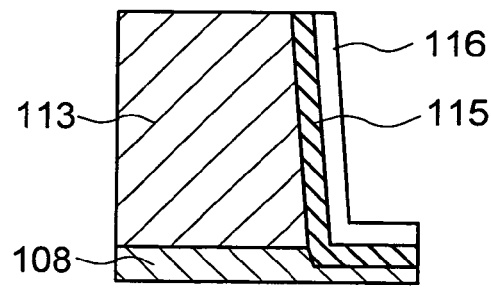
FIG. 11A to FIG. 11D are partially enlarged views of a lower end periphery L of the plate electrode 113 in the processes shown in FIGS. 4, 5, 7, and 9, respectively, in the method of manufacturing the semiconductor device according to the embodiment of the present invention.
Figure 11B:
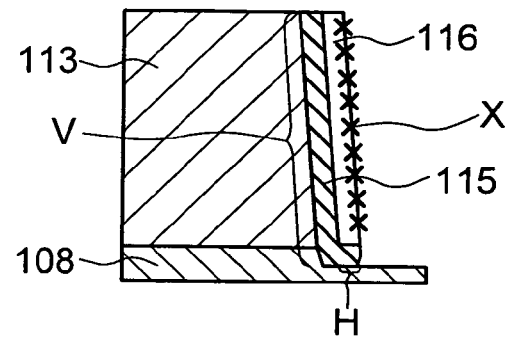
Figure 11C:
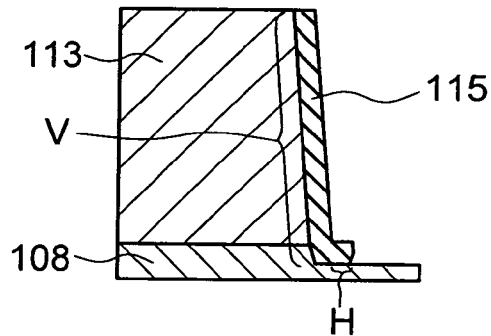

As shown in FIG. 11A (corresponding to FIG. 4), the capacitor insulating film (tantalum oxide film) 115 and the protection insulating film (silicon oxide film) 116 are laminated on the whole side surface (inner side surface of the through-hole 114) of the patterned plate electrode 113 to cover this side surface. The whole surface is then etched back. As a result, as shown in FIG. 11B (corresponding to FIG. 5), the protection insulating film 116 and the capacitor insulating film 115 on the base silicon nitride film 108 (the bottom portion of the through-hole 114) are removed. In this case, an adhesion X of an etching damage, a residual molecule of the etching product, or the like occurs on the surface of the protection insulating film 116. However, the adhesion X of the etching damage or the like does not reach the surface of the capacitor insulating film 115. Thereafter, the protection insulating film 116 including the adhesion X of the etching damage or the like is removed. As a result, as shown in FIG. 11C (corresponding to FIG. 7), only the good-quality capacitor insulating film 115 having no etching damage or the like remains on the side surface of the plate electrode 113. The silicon oxide film 116 as a protection insulating film can be removed by wet etching using hydrofluoric acid. Since the tantalum oxide film 115 as the capacitor insulating film has high etching resistance against hydrofluoric acid and the like, the tantalum oxide film 115 is little damaged in the process of removing the silicon oxide film 116.

Figure 11D:
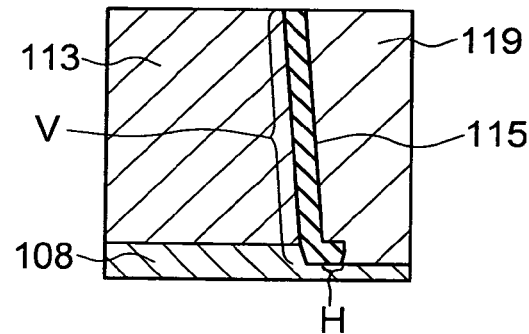

Accordingly, as shown in FIG. 11D (corresponding to FIG. 9), when the storage electrode 119 is formed on the capacitor insulating film 115 having a clean surface, occurrence of leakage current in the capacitor can be suppressed, and a highly reliable capacitor can be obtained.

In the present embodiment, after the protection insulating film 116 is formed on the capacitor insulating film 115, the protection insulating film 116 and the capacitor insulating film 115 are etched back. With this arrangement, as shown in FIG. 11B to FIG. 11D, after ending the etch back process, the capacitor insulating film 115 has a substantially vertical part V along the side surface of the plate electrode 113, and a horizontal part H that extends substantially parallel with the semiconductor substrate in the direction of the storage electrode 119 from the lower end of the vertical part V. Owing to the presence of the horizontal part H, a distance between the plate electrode 113 and the storage electrode 119 is secured at the lower end of the capacitor insulating film 115. Consequently, occurrence of leakage current can be suppressed. The length of the horizontal part H substantially corresponds to the thickness of the protection insulating film 116. Therefore, the length can be adjusted by suitably changing the thickness of the protection insulating film 116.

In the present, embodiment, as shown in FIG. 4, the cap insulating film is formed on the plate electrode 113, and the capacitor insulating film 115 and the protection insulating film 116 are formed on this cap insulating film. This has the following effects.

When anisotropic etching (etch back) process is performed after the capacitor insulating film 115 and the protection insulating film 116 are formed as shown in FIG. 4, a film thickness at the upper end of the capacitor insulating film 115 becomes smaller than that of other parts as shown in FIG. 5. However, in the present embodiment, at the end of the anisotropic etching, the upper end of the capacitor insulating film 115 is kept within the film thickness of the cap insulating film 112. In other words, anisotropic etching is controlled so that the capacitor insulating film 115 covers at least a part of the side surface of the cap insulating film 112 at the end of the etching. Accordingly, the side surface of the plate electrode 113 can be covered with the capacitor insulating film 115 having a sufficient thickness, up to the upper end of the plate electrode 113. As a result, as shown in FIG. 9, the upper end of each of the capacitor insulating films 115 does not become thin at the upper end of the plate electrode 113 of the capacitor layer 10, and increase in leakage current can be suppressed.

A pattern formed by lithography is usually narrower than a desired pattern. However, in the present embodiment, the plate electrode is formed before the storage electrodes by lithography. Therefore, even when the pattern of the plate electrode is narrower than the desired pattern, the surface area of the storage electrode formed thereafter is not made smaller, and is rather increased. In other words, even when the pattern shape of the plate electrode varies due to the variation in the lithography condition, this variation works to increase the electrostatic capacity, as compared with a storage electrode of island-shape pattern which is independently formed beforehand as in the conventional process. Therefore, a possibility of a capacity shortage can be reduced.

Figure 12:
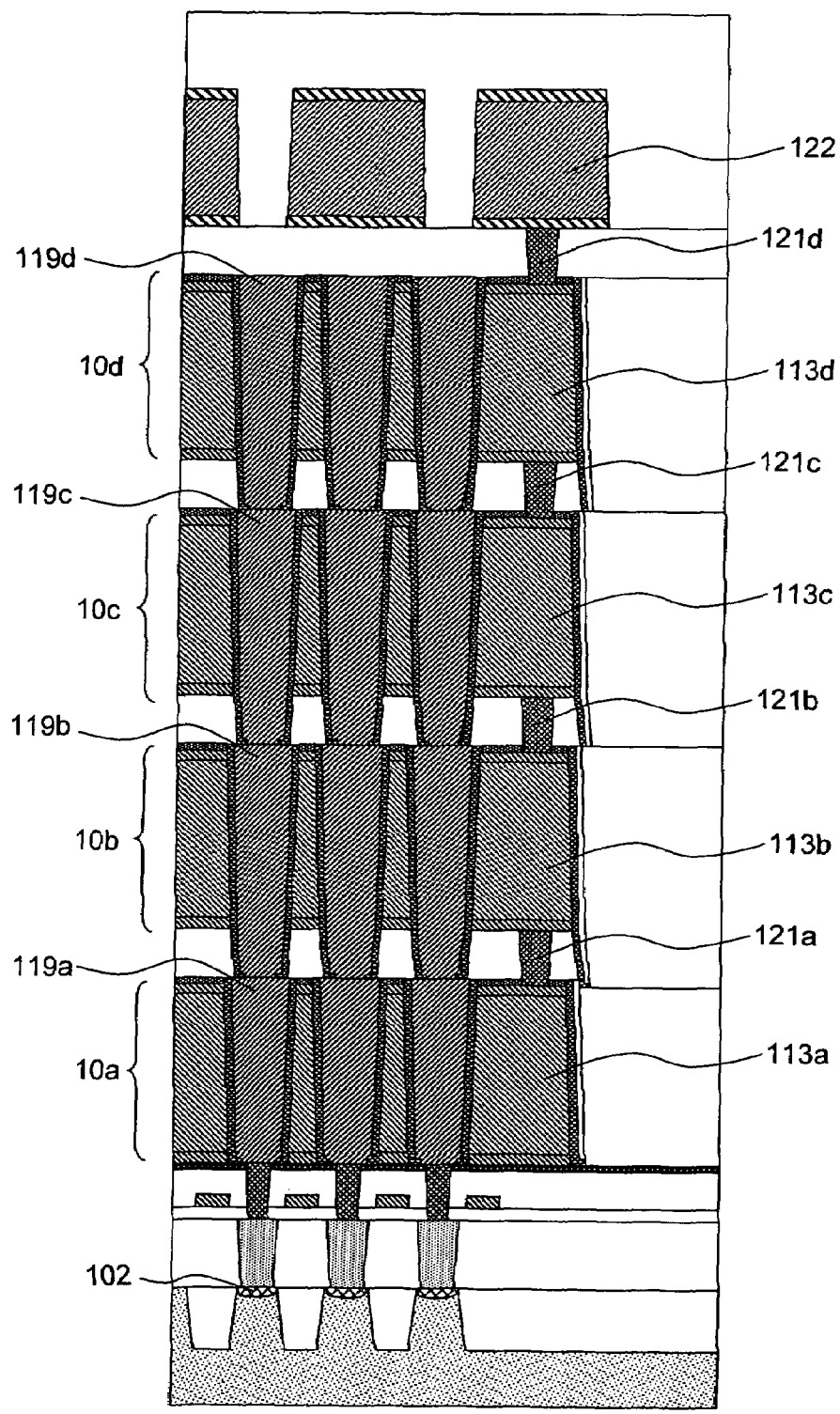
FIG. 12 is a cross-sectional diagram of the DRAM when there are four capacitor layers in the embodiment of the present invention.
Figure 13A:
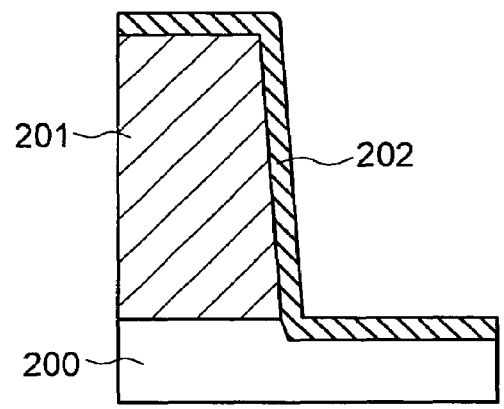
FIG. 13A to FIG. 13C are processes of forming one capacitor layer of a capacitor having the laminated configuration.
Figure 13B:
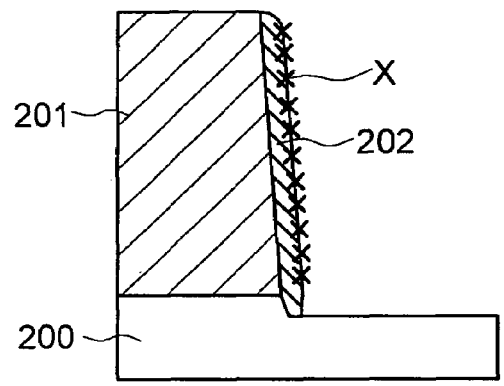
Figure 13C:
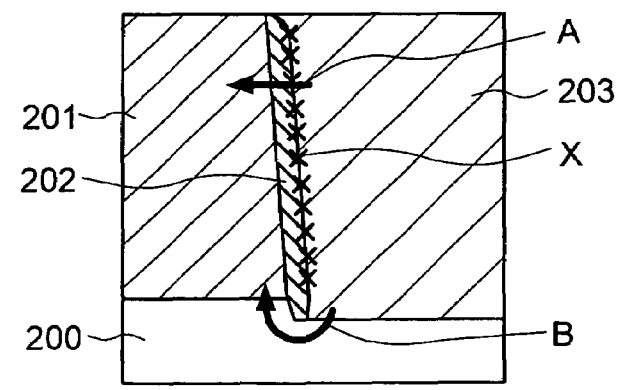

In the present embodiment, plural capacitor layers having the same shape as that of the capacitor layer 10 can be also laminated, by repeating plural times substantially the same process as shown in FIG. 2 to formation of the contact plug 121 in FIG. 10, after forming the interlayer insulating film 120 and the contact plug 121 shown in FIG. 10. FIG. 12 shows one example of this configuration. FIG. 12 shows a configuration of a DRAM obtained by laminating four capacitor layers 10a to 10d. Plate electrodes 113a to 113d of the capacitor layers are electrically connected by contact plugs 121a to 121c, and are connected to a higher wiring layer 122 by a contact plug 121d. Storage electrodes 119a to 119d of the capacitor layers are connected vertically, and are electrically connected to the diffusion layers 102 provided on the semiconductor substrate, respectively. By laminating the plural capacitor layers, a large electrostatic capacitance can be obtained. According to the present embodiment, even when such a complex capacitor configuration is adopted, leakage current can be suppressed, and a capacitor having high reliability can be obtained.

While preferred embodiments of the present invention have been described hereinbefore, the present invention is not limited to the aforementioned embodiments and various modifications can be made without departing from the spirit of the present invention. It goes without saying that such modifications are included in the scope of the present invention.

While, as an example, the plate electrode is formed first and then the storage electrode is formed in the above embodiment, the present invention is not limited to this particular process. Alternatively, the storage electrode can be formed first, and then, the plate electrode can be formed. When the plate electrode is formed first in the present invention, the above effect can be obtained.

While a laminated film of a Ti/TiN film, an AlCu film, and a TiN film is used for the plate electrode in the above embodiment, other conductive materials such as a tungsten film may be used instead. Materials of other insulating films and wirings can be also suitably changed.

An aluminum oxide film or an hafnium oxide film, or a laminated film of these films can be used, instead of the tantalum oxide film, for the material of the capacitor insulating film.

According to the present invention, anisotropic etching is performed after a protection insulating film is formed on a capacitor insulating film. Therefore, the occurrence of an etching damage on the surface of the capacitor insulating film can be prevented.

Further, a part of the capacitor insulating film extending in a lateral direction corresponding to a film thickness of the protection insulating film is formed at a lower end of the capacitor insulating film. Therefore, the occurrence of leakage current of a capacitor at the lower end of the capacitor insulating film can be suppressed.

What is claimed is:

1. A semiconductor device manufacturing method, comprising:
   a first step of forming a first electrode of a capacitor on a semiconductor substrate;
   a second step of forming a capacitor insulating film on the whole surface including a side surface and an upper surface of the first electrode;
   a third step of forming a protection insulating film made of a material different from that of the capacitor insulating film, on the capacitor insulating film;
   a fourth step of removing the protection insulating film and the capacitor insulating film from the upper surface of the first electrode, by anisotropically etching the protection insulating film and the capacitor insulating film;
   a fifth step of removing the protection insulating film that remains on the side surface of the first electrode; and
   a sixth step of forming a second electrode of the capacitor on the capacitor insulating film, after removing the protection insulating film.

2. The semiconductor device manufacturing method as claimed in claim 1, wherein
   at the first step, a cap insulating film of the same pattern as that of the first electrode is formed on the first electrode, and
   at the end of the anisotropic etching at the fourth step, the anisotropic etching is controlled so that the capacitor insulating film covers at least a part of the side surface of the cap insulating film.

3. The semiconductor device manufacturing method as claimed in claim 2, wherein
   the first electrode is a plate electrode, and the second electrode is a storage electrode.

4. The semiconductor device manufacturing method as claimed in claim 3, wherein
   the first step comprises:
   a first sub step of forming a first electrode material on the semiconductor substrate; and
   a second sub step of forming the plate electrode by patterning the first electrode material.

5. The semiconductor device manufacturing method as claimed in claim 4, wherein
 by the patterning at the second sub step, through-holes are formed in the plate electrode,
 at the fourth step, the laminated film of the capacitor insulating film and the protection insulating film is left on the inner side surface of the through-holes, and bottom portions of the through-holes are exposed, and
 at the sixth step, a second electrode material is filled in the through-holes to form the storage electrode.

6. The semiconductor device manufacturing method as claimed in claim 1, wherein
 the first electrode is a plate electrode, and the second electrode is a storage electrode.

7. The semiconductor device manufacturing method as claimed in claim 6, wherein
 the first step comprises:
 a first sub step of forming a first electrode material on the semiconductor substrate; and
 a second sub step of forming the plate electrode by patterning the first electrode material.

8. The semiconductor device manufacturing method as claimed in claim 7, wherein
 by the patterning at the second sub step, through-holes are formed in the plate electrode,
 at the fourth step, the laminated film of the capacitor insulating film and the protection insulating film is left on the inner side surface of the through-holes, and bottom portions of the through-holes are exposed, and
 at the sixth step, a second electrode material is filled in the through-holes to form the storage electrode.

9. The semiconductor device manufacturing method as claimed in claim 8, wherein
 the capacitor includes a plurality of laminated capacitor layers, each of the laminated capacitor layers has the first electrode, the capacitor insulating film and the second electrode, and the first electrode and the second electrode of each of the laminated capacitor layers are electrically connected to each other, respectively.

10. The semiconductor device manufacturing method as claimed in claim 7, wherein
 the capacitor includes a plurality of laminated capacitor layers, each of the laminated capacitor layers has the first electrode, the capacitor insulating film and the second electrode, and the first electrode and the second electrode of each of the laminated capacitor layers are electrically connected to each other, respectively.

11. The semiconductor device manufacturing method as claimed in claim 10, wherein
 the protection insulating film is a silicon oxide film.

12. The semiconductor device manufacturing method as claimed in claim 1, wherein
 the capacitor includes a plurality of laminated capacitor layers, each of the laminated capacitor layers has the first electrode, the capacitor insulating film and the second electrode, and the first electrode and the second electrode of each of the laminated capacitor layers are electrically connected to each other, respectively.

13. The semiconductor device manufacturing method as claimed in claim 1, wherein
 the capacitor insulating film is any one of a tantalum oxide film, an aluminum oxide film, an hafnium oxide film, and a laminated film including one of an aluminum oxide film and an hafnium oxide film.

14. The semiconductor device manufacturing method as claimed in claim 1, wherein
 the protection insulating film is a silicon oxide film.

15. A semiconductor device manufacturing method, comprising:
 a first step of forming a first electrode of a capacitor on a semiconductor substrate;
 a second step of forming a capacitor insulating film on the whole surface including a side surface and an upper surface of the first electrode;
 a third step of forming a protection insulating film made of a material different from that of the capacitor insulating film, on the capacitor insulating film;
 a fourth step of removing the protection insulating film and the capacitor insulating film which are formed on the upper surface of the first electrode;
 a fifth step of removing the protection insulating film that remains on the side surface of the first electrode; and
 a sixth step of forming a second electrode of the capacitor on the capacitor insulating film.

16. The semiconductor device manufacturing method as claimed in claim 15, wherein at the fourth step, the protection insulating film and the capacitor insulating film are removed by anisotropically etching, and at the fifth step, the protection insulating film is removed by wet etching.

17. The semiconductor device manufacturing method as claimed in claim 16, wherein at the first step, through-holes are formed in the first electrode by patterning the first electrode, at the fourth step, the laminated film of the capacitor insulating film and the protection insulating film is left on the inner side surface of the through-holes, and bottom portions of the through-holes are exposed, and at the sixth step, a second electrode material is filled in the through-holes.

18. The semiconductor device manufacturing method as claimed in claim 17, wherein the capacitor includes a plurality of laminated capacitor layers, each of the laminated capacitor layers has the first electrode, the capacitor insulating film and the second electrode, and the first electrode and the second electrode of each of the laminated capacitor layers are electrically connected to each other, respectively.

19. The semiconductor device manufacturing method as claimed in claim 15, wherein at the first step, through-holes are formed in the first electrode by patterning the first electrode, at the fourth step, the laminated film of the capacitor insulating film and the protection insulating film is left on the inner side surface of the through-holes, and bottom portions of the through-holes are exposed, and at the sixth step, a second electrode material is filled in the through-holes.

* * * * *